(12) United States Patent
Arita et al.

(10) Patent No.: US 6,867,146 B2
(45) Date of Patent: Mar. 15, 2005

(54) PLASMA PROCESSING METHOD

(75) Inventors: Kiyoshi Arita, Munakata-gun (JP); Tetsuhiro Iwai, Kasuga (JP)

(73) Assignee: Matsushita Electric Industrial Co., Ltd. (JP)

( * ) Notice: Subject to any disclaimer, the term of this patent is extended or adjusted under 35 U.S.C. 154(b) by 351 days.

(21) Appl. No.: 10/085,128

(22) Filed: Mar. 1, 2002

(65) Prior Publication Data

US 2002/0173161 A1 Nov. 21, 2002

(30) Foreign Application Priority Data

Apr. 5, 2001 (JP) ........................................ 2001-106756

(51) Int. Cl.[7] ..................... H01L 21/302; H01L 21/461
(52) U.S. Cl. ........................................ 438/714; 438/719
(58) Field of Search ................................. 438/706–710, 438/714, 719, 720, 721

(56) References Cited

U.S. PATENT DOCUMENTS

| | | | | |
|---|---|---|---|---|
| 5,443,689 A | * | 8/1995 | Kimura et al. ................. 216/63 |
| 5,536,364 A | * | 7/1996 | Yoshida et al. ............. 438/719 |
| 5,556,500 A | * | 9/1996 | Hasegawa et al. ..... 156/345.27 |
| 5,686,363 A | * | 11/1997 | Tabara ......................... 438/695 |
| 5,770,098 A | * | 6/1998 | Araki et al. ................... 216/67 |
| 5,843,226 A | * | 12/1998 | Zhao et al. ..................... 117/97 |
| 6,239,036 B1 | | 5/2001 | Arita et al. ................. 438/714 |
| 6,277,752 B1 | * | 8/2001 | Chen .......................... 438/692 |
| 6,322,714 B1 | * | 11/2001 | Nallan et al. ................. 216/67 |
| 6,333,271 B1 | * | 12/2001 | Chiu et al. ................... 438/706 |
| 6,486,069 B1 | * | 11/2002 | Marks et al. ............... 438/706 |
| 6,670,276 B1 | * | 12/2003 | Suemasa et al. ............ 438/706 |

FOREIGN PATENT DOCUMENTS

| | | |
|---|---|---|
| JP | 2000-058521 | 2/2000 |
| JP | 2000-133639 | 5/2000 |

* cited by examiner

Primary Examiner—Duy-Vu N. Deo
(74) Attorney, Agent, or Firm—Parkhurst & Wendel, L.L.P.

(57) ABSTRACT

A method of plasma-processing a silicon-based substrate provides a mirror-like etched surface of the substrate. A silicon wafer having a protective tape affixed to a circuit-formed side of the wafer is mounted on a mounting unit disposed within a process chamber of a plasma processing apparatus while the protective tape contacts on the mounting unit. The surface of the silicon wafer is kept at a temperature of 40° C. or above when the surface of the substrate is etched by plasma generated by plasma discharge in plasma-generating gas including fluorine-containing gas fed into the process chamber. This suppressing adhesion and accumulation of a reaction product of the fluorine-containing gas with respect to the surface to be etched, and consequently, provides the surface with uniform etching.

4 Claims, 5 Drawing Sheets

PLASMA PROCESSING METHOD

FIELD OF THE INVENTION

The present invention relates to a plasma processing method of etching a silicon-based substrate such as a silicon wafer or the like with plasma.

BACKGROUND OF THE INVENTION

In a process of manufacturing a silicon substrate for a semiconductor device, the substrate is thinned according to a thinner shape of the semiconductor device. This thinning process is performed, subsequently to forming a circuit pattern on the silicon substrate, by mechanically polishing a back side opposite to the circuit-formed side. The mechanical polishing entails forming a stressed layer including a micro-crack at the surface of the silicon substrate. In order that strength of the silicon substrate is prevented from decrease due to this stressed layer, etching is performed to remove the stressed layer after the mechanical polishing. For this etching, plasma etching is utilized in place of conventional wet etching with chemical solution.

In order to achieve a higher etching rate, this plasma etching directed to silicon employs gas including carbon tetrafluoride gas as plasma-generating gas. The carbon tetrafluoride gas is ionized or excited by plasma discharge to form an ion and radical which in turn etch the silicon surface.

In the plasma etching using carbon tetrafluoride, a carbon-containing film, i.e., compound of fluorine and carbon, which is a reaction product generated in the plasma processing for the silicon surface, re-adheres to a portion of the silicon surface. This re-adhering compound prevents the plasma etching from being proceeded thus reducing an overall etching rate and varying plasma etching effect according to the degree of the re-adhesion. Consequently, the etched surface has a hazy appearance and hence has reduced visual quality.

This hazy appearance prevents the presence of a fine flaw or the like from being checked visually after the etching, thus impairing quality control. Further, a user who demands a mirror-like appearance qualifies the quality of the appearance of the silicon wafer as a product low.

SUMMARY OF THE INVENTION

A method of plasma-processing a silicon-based substrate is provided for providing a mirror-like etched surface.

In the method, the silicon-containing substrate is mounted on a mounting unit disposed within a process chamber, plasma is generated through feeding plasma-generating gas including fluorine-containing gas into the process chamber and causing plasma discharge, and the silicon-containing substrate is etched With the plasma generated while the silicon-containing substrate is held at a temperature of 40° C. or higher.

DESCRIPTION OF THE PREFERRED EMBODIMENT

Figure 1:
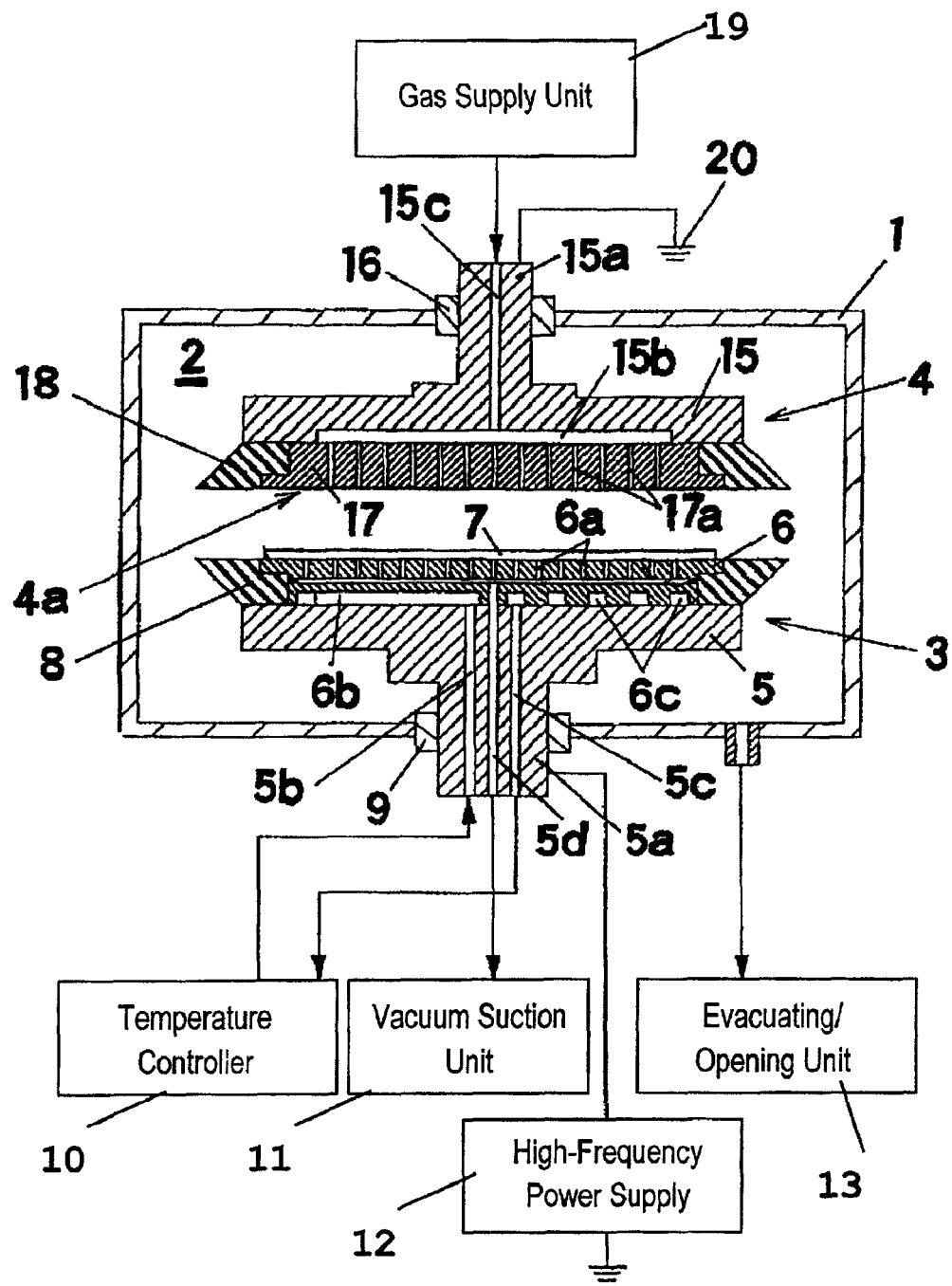
FIG. 1 is a cross section of a plasma-processing apparatus in accordance with an exemplary embodiment of the present invention.
Figure 2:
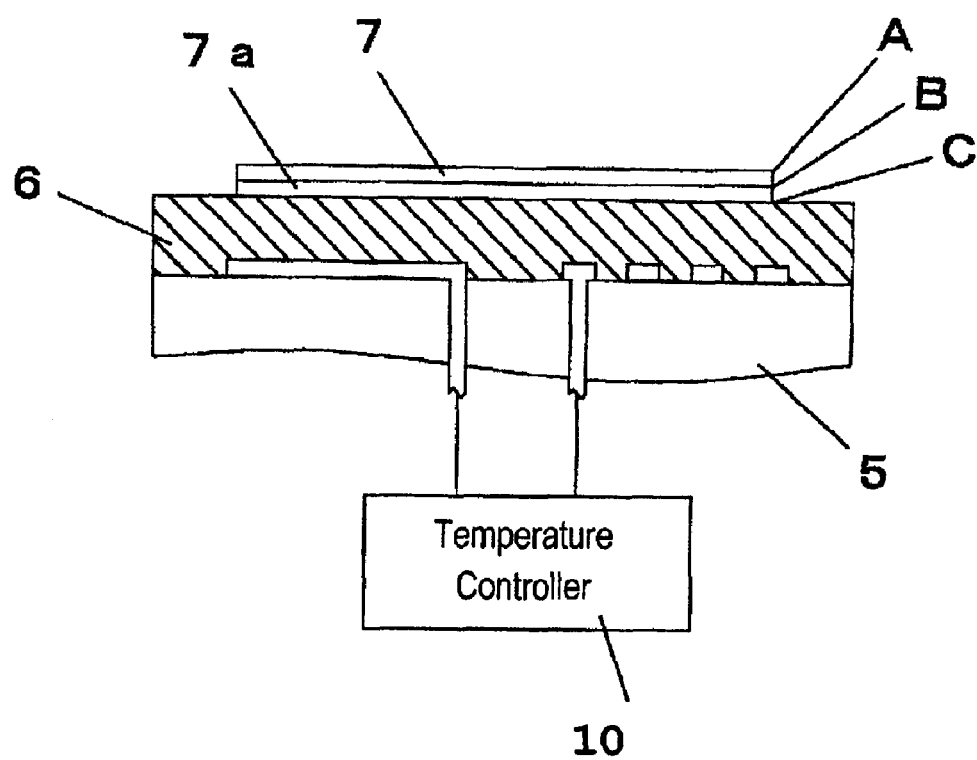
FIG. 2 is a partially sectional view of a lower electrode assembly of the plasma processing apparatus in accordance with the embodiment.
Figure 3A:
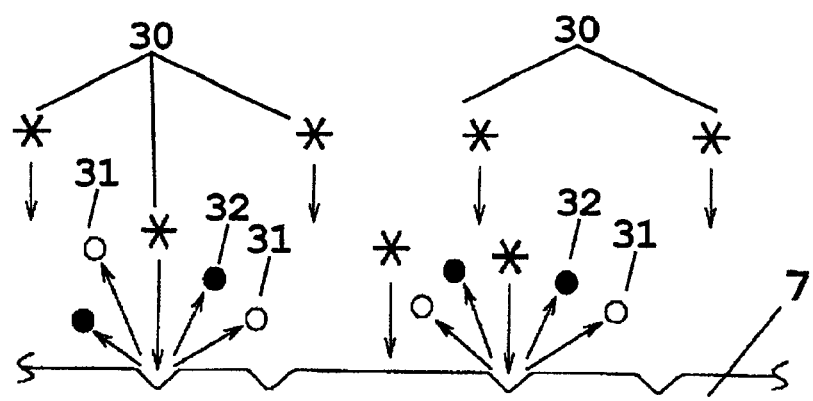
FIGS. 3A and 3B illustrate plasma etching for a silicon wafer in accordance with the embodiment.
Figure 3B:
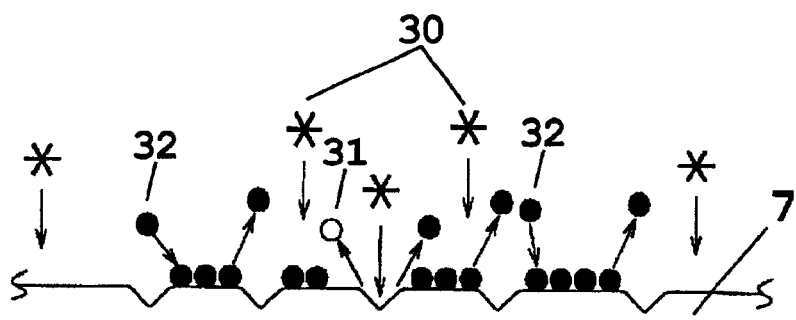
Figure 4:
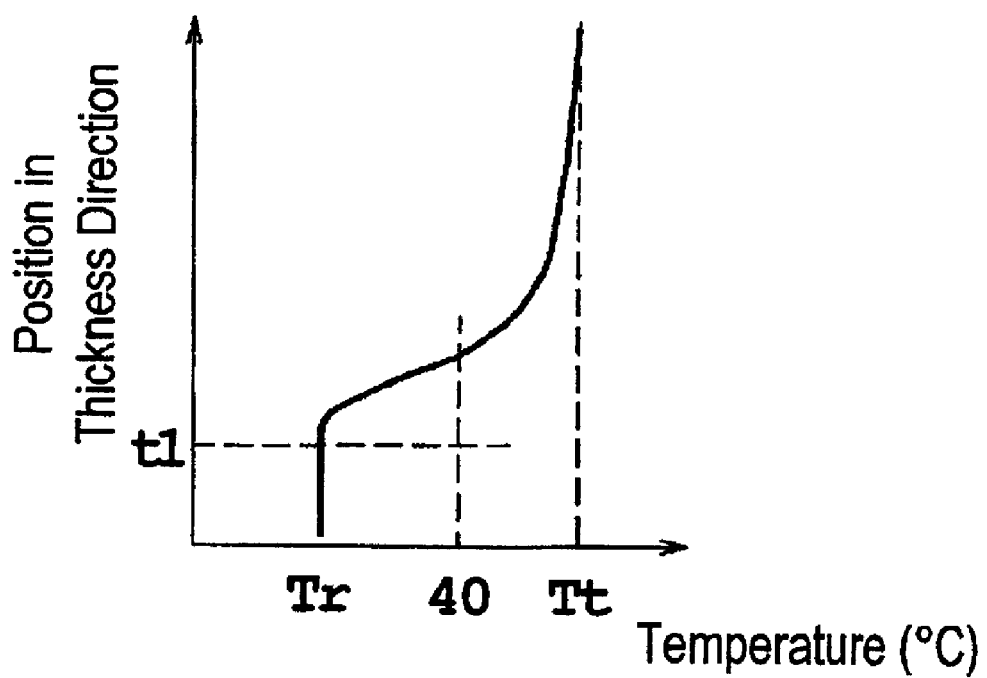
FIG. 4 is a graph showing variations in temperature of the silicon wafer in the plasma processing i n accordance with the embodiment.
Figure 5A:
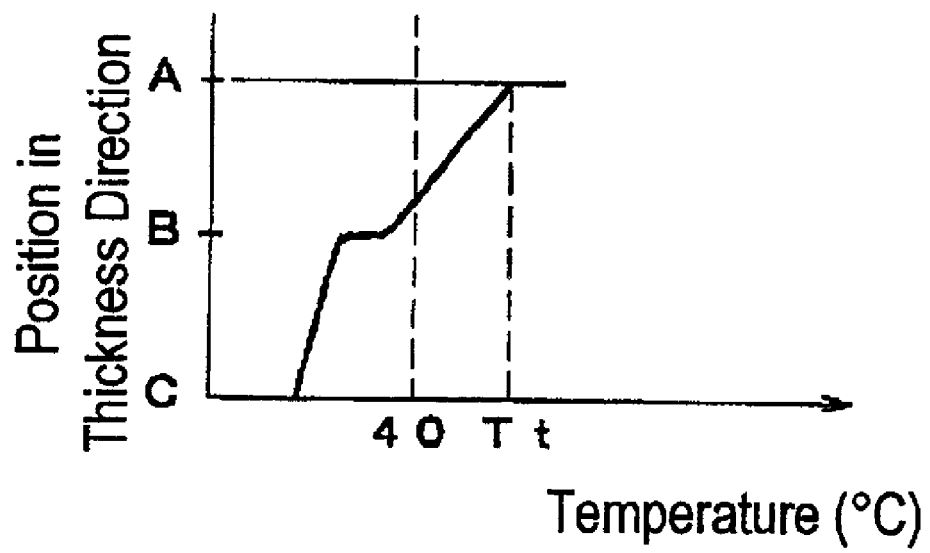
FIGS. 5A and 5B are graphs each showing a temperature distribution of the silicon wafer in the plasma processing in accordance with the embodiment.
Figure 5B:
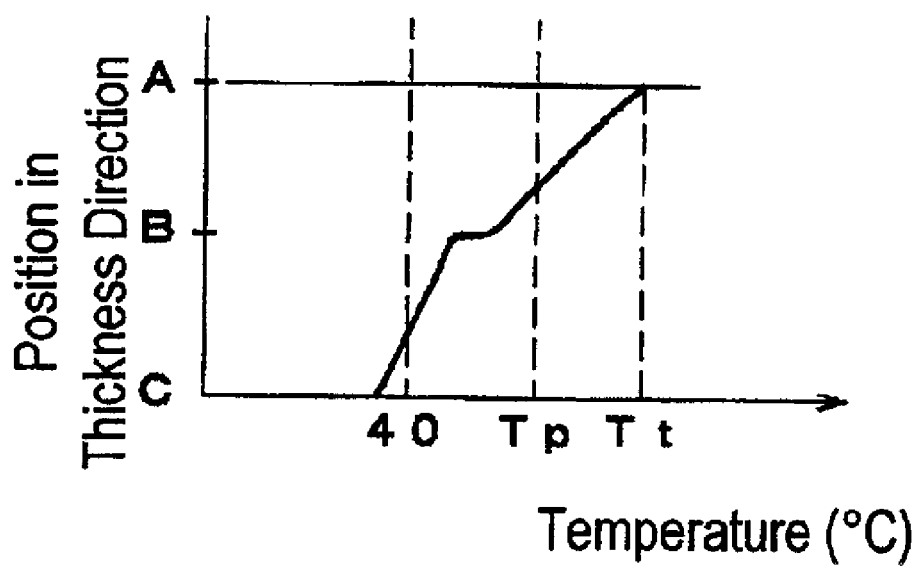

FIG. 1 is a cross section of a plasma processing apparatus in accordance with an exemplary embodiment of the present invention, and FIG. 2 is a partially sectional view of a lower electrode assembly of the plasma processing apparatus. FIG. 3A and FIG. 3B illustrate plasma etching for a silicon wafer in accordance with the embodiment. FIG. 4 is a graph showing variations in temperature of the silicon wafer in the plasma processing in accordance with the embodiment, and FIG. 5A and FIG. 5B are graphs each showing a temperature distribution of the silicon wafer in the plasma processing.

Referring to FIG. 1, the plasma processing apparatus will be explained. The inside of a vacuum chamber 1 is a process chamber 2 for plasma processing. In the process chamber 2, a lower electrode assembly 3 and an upper electrode assembly 4 are arranged so as to be vertically opposed to each other. The lower electrode assembly 3 is provided with an electrode 5 mounted to the vacuum chamber 1 via an insulator 9 by a downwardly-extended support 5a. A mounting unit 6 made of material with a high heat conductivity is mounted to the top surface of the electrode 5. On the top surface of the mounting unit 6, a silicon wafer 7, a silicon-based substrate, is mounted.

A back side of the wafer 7 positioned opposite a circuit-formed side is thinned by mechanical polishing. As shown in FIG. 2, the wafer 7 is mounted with a protective tape 7a, which is affixed to the circuit-formed side, contacting the mounting unit 6, that is, with the polished surface (the back side positioned opposite the circuit-formed side) to be processed facing upward.

The mounting unit 6 has plural suction holes 6a opening onto its top surface. The suction holes 6a communicate with a suction passage 5d bored through the support 5a of the electrode 5. The suction passage 5d is connected to a vacuum suction unit 11. While being mounted on the top surface of the mounting unit 6, the wafer 7 is held with the mounting unit 6 through vacuum suction performed by the vacuum suction unit 11. The lower electrode assembly 3 having the electrode 5 and mounting unit 6, and the vacuum suction unit 11 thus form holding means for holding the wafer 7. Another example of the holding means may be such that wafer 7 is attracted and held by electrostatic force caused by applying a DC voltage to electrode 5.

Cooling medium channels 6b, 6c are provided inside the mounting unit 6 and communicate with respective pipelines 5b, 5c bored through the support 5a. Pipelines 5b, 5c are connected to a temperature controller 10. The controller 10 is driven to circulate cooling medium such as cooling water or the like through the channels 6b, 6c, whereby the mounting unit 6 heated during plasma processing is cooled, and the temperature of the mounting unit 6 is controlled. The temperature of the mounting unit 6 is controlled for the purpose of holding the wafer 7 at a designated process temperature during plasma etching. Through this temperature control, an etching rate for the surface to be processed can be uniform during plasma etching, and a mirror-like etched surface without haziness can be obtained (will be described later).

The electrode 5 is electrically connected to a high-frequency power supply 12. The process chamber 2 within the vacuum chamber 1 is connected to an evacuating/opening unit 13. The unit 13 evacuates the process chamber 2 and opens the process chamber 2 to atmospheric air in the case of vacuum break in the chamber 2.

The upper electrode assembly (opposed electrode assembly) 4 is provided with an electrode 15 connected to a ground 20. The electrode 15 is mounted to the vacuum chamber 1 via the insulator 16 with an upwardly-extended support 15a. A porous member 17 including plural micropores positioned at random is mounted on the bottom surface of the electrode 15, and these micropores communicate with a void 15b provided inside the electrode 15. The void 15b is coupled to a gas supply unit 19 via a gas supply passage 15c bored through a support 15a.

The gas supply unit 19 supplies gas including a fluorine-containing gas such as carbon tetrafluoride ($CF_4$), sulfur hexafluoride ($SF_6$) or the like as plasma-generating gas. The plasma-generating gas is ejected downward from the respective micropores of the porous member 17 of the upper electrode assembly 4 when the gas supply unit 19 is driven subsequently to the evacuation of the process chamber 2 that is performed by the evacuating/opening unit 13 being driven. With the plasma-generating gas being ejected, the high-frequency power supply 12 applies a high-frequency voltage to the electrode 5 of the lower electrode assembly 3. Consequently, a plasma discharge is caused in a space between the upper and lower electrode assemblies 4, 3. With plasma generated by the plasma discharge, plasma etching is performed on the top surface of the silicon wafer 7 mounted on mounting unit 6.

Then, the process of the plasma etching will be described with reference to FIGS. 3A and 3B. As the plasma discharge is generated in the gas including $CF_4$ or $SF_6$ in the space above the wafer 7, gaseous fluorine radicals ($xCFy^*$ or $xSFy^*$) 30 are generated as shown in FIG. 3A. The fluorine radicals 30 each act on Si, which is a component of the wafer 7, so that, as shown in FIG. 3A, Si forms gaseous silicon tetrafluorides 31 which transpire from the surface of the wafer 7 and are removed.

Concurrently with this reaction, a compound (xCFz) 32 of fluorine and carbon or a compound (xSFz) 32 of fluorine and sulfur is generated as a reaction product. In the process of plasma processing, as shown in FIG. 3B, the reaction product re-adheres onto and accumulates on the surface of the wafer 7, and the accumulating reaction product separates from the surface of the wafer 7 again, behaving unstably.

In other words, in the plasma etching that uses the fluorine-containing gas and is directed to the wafer 7, an etching phenomenon in which silicon is removed from the surface of the wafer 7 and the re-adhesion and re-separation of the reaction product simultaneously proceed in parallel. In a portion where the re-adhering reaction product forms a deposit layer, the fluorine radical does not act on the silicon surface, so that silicon is not removed. For this reason, the portion having the remaining reaction product which has once re-adhered as the deposit layer remains unetched even after the completion of plasma etching.

Such unetched portion is fine and spot-like and is distributed at random, so that the etched surface has a hazy appearance. Such variations in etching take place as the reaction product yielded by the reaction of fluorine radicals and silicon re-adheres to and remains on the silicon wafer, forming the deposit layers as described above. For being prevented from having the hazy etched surface such as described above, the silicon wafer 7 may be processed under such a condition that the reaction products separate immediately after their re-adhesion without becoming stable to remain on the surface of the wafer 7.

In the plasma processing described in the present embodiment, to realize the above-mentioned condition, the temperature of the wafer 7 is set so as to facilitate the separation of the reaction products. In other words, raising the temperature of the surface of wafer 7 activates movements of molecules of the gaseous reaction product. This decreases the probability that the molecules remain stably on the surface of the wafer when these molecules crash against the surface, thus increasing the degree of their separation from the surface of the wafer 7.

Referring to FIGS. 4, 5A and 5B, the temperature condition for the wafer 7 in the plasma processing will be explained. FIG. 4 shows the temperature variations of the surface of the wafer 7 after the initiation of plasma processing. The wafer 7, the initial temperature of which has been room temperature Tr, is heated by the plasma discharge and gradually rises in temperature after a lapse of time t1 for the initiation of discharge. Here, the temperature controller 10 sets the temperature of the surface of wafer 7 to converge to preset process temperature Tt.

In other words, the temperature control condition is set so as to cause heat generated by the plasma discharge to balance, in steady-state plasma processing, with heat removed by the cooling medium (temperature controlling medium) circulated through the mounting unit 6 to cool the unit 6. Since the heat transmitted from the wafer 7 to the mounting unit 6 is defined by a heat insulating property of the protective tape 7a, the temperature control condition to be used changes depending on the type of the tape 7a. The temperature control condition is determined through trials of plasma process conditions including a plasma process pressure, a distance between the discharge electrodes, an output of the high-frequency power supply and others.

FIG. 5A shows the temperature distribution during the plasma processing along the thickness of silicon wafer 7, that is, respective temperatures at a surface A of the wafer 7, at a contact surface B where the wafer 7 and the tape 7a contact, and at a contact surface C where the tape 7a and the mounting unit 6. During the plasma processing, the surface A of wafer 7 is controlled by temperature controller 10 so as to be held at a process temperature Tt set at 40° C. or above.

Here, the temperature of the protective tape 7a is always maintained at 40° C. or below as shown in a range from the contact surface B to the surface C on the vertical axis of the graph of FIG. 5A. Thus, tape 7a is inhibited from rising in temperature and can be prevented from melting due to overheating.

In cases where protective tape 7a is made of material having a high heat resistance, process temperature Tt can be higher. In other words, in this case, the temperature controller 10 sets such a temperature control condition as to cause the temperature at surface B to become equal to lower than heat resistance temperature Tp of the tape 7a. Thus, the process temperature Tt of the surface of the wafer 7 can be relatively higher than that of the case of FIG. 5A, and consequently, inhibits the reaction product more effectively from accumulating.

TABLE 1

| Temperature Tt (° C.) | 20 | 30 | 40 | 50 | 60 |
|---|---|---|---|---|---|
| Visual Evaluation | Defective | Defective | Good | Good | Good |

Table 1 shows a result of visual evaluation performed on the etched surfaces according to various process temperature Tt of the surface of wafer 7. According to this result, at the process temperatures Tt below 40°C., the etched surfaces have hazy appearance and are qualified defective in visual quality, whereas at the process temperatures Tt of 40° C. and above, the etched surfaces are qualified good.

As clear from the comparison of the case of high temperatures, that is, 50° C. and 60° C. and the case of 40° C., the more the temperature is raised, the less the degree of haziness, and the appearance of the wafer 7 becomes more mirror-like. This is because the more process temperature Tt is raised, the more the separation of the reaction product from the surface of wafer 7 is promoted. Thus, in cases where the appearance of the etched surface is requested to become more mirror-like, the process temperature Tt is set as high as possible as far as the plasma processing apparatus and the heat resistance temperature condition of the protective tape permit.

This plasma processing can remove a stressed layer including a microcrack formed at the polished surface in the previous mechanical polishing process efficiently. The plasma processing terminates when the silicon wafer 7 to be plasma-processed is transferred from the process chamber 2 after being released from the vacuum suction of the mounting unit 6. This plasma processing can provide the appearance of the etched surface substantially mirror-like without haziness as described above, thus providing the appearance of excellent quality.

In the embodiment described above, the silicon wafer for a semiconductor device is used as the silicon-based substrate to undergo the plasma processing. However, the present invention is not limited to be applicable only to the silicon wafer. The present invention may be applicable to a material such as a quartz plate for a quartz oscillator or the like as far as material contains silicon.

What is claimed is:

1. The plasma-processing method of comprising:

providing a grounded electrode located within a process chamber;

mounting a silicon-containing substrate on a mounting unit comprising an electrode located within the process chamber;

generating plasma by feeding plasma-generating gas comprising fluorine-containing gas into the process chamber and causing a plasma discharge by applying a high frequency voltage across a volume of gas within said chamber between said mounting unit and the grounded electrode; and etching the silicon-containing substrate with the plasma while keeping the silicon-containing substrate at a temperature of at least 40° C.

wherein the silicon-containing substrate is a silicon wafer having a first side having a protective tape affixed thereon and a second side opposite the first side, wherein said mounting the silicon-containing substrate comprises mounting the silicon wafer on the mounting unit with the protective tape located between the wafer and the mounting unit, and wherein said etching the silicon-containing substrate comprises etching the second side while the mounting unit is held at the temperature.

2. The method of claim 1, additionally comprising removing from the second side of the silicon wafer a stressed layer previously formed by polishing or grinding, and removing the stressed layer before etching the second side.

3. The method of claim 1, wherein the said temperature is below a heat resistance temperature of the protective tape.

4. The method of claim 1, wherein the fluorine-containing gas is selected from the group consisting of carbon tetrafluoride and sulfur hexafluoride.

* * * * *

UNITED STATES PATENT AND TRADEMARK OFFICE
CERTIFICATE OF CORRECTION

PATENT NO. : 6,867,146 B2
DATED : March 15, 2005
INVENTOR(S) : Kiyoshi Arita et al.

It is certified that error appears in the above-identified patent and that said Letters Patent is hereby corrected as shown below:

Column 6,
Line 20, change "C." to -- C, --.

Signed and Sealed this

Twenty-eighth Day of June, 2005

JON W. DUDAS
*Director of the United States Patent and Trademark Office*